(12) United States Patent
Yeh et al.

(10) Patent No.: US 8,173,504 B2
(45) Date of Patent: May 8, 2012

(54) METHOD OF FABRICATING GATE ELECTRODE USING A TREATED HARD MASK

(75) Inventors: Matt Yeh, Hsinchun (TW); Fan-Yi Hsu, Toufen Town (TW); Shun Wu Lin, Taichung (TW); Hui Ouyang, Chubei (TW); Chi-Ming Yang, Hsian-San District (TW)

(73) Assignee: Taiwan Semiconductor Manufacturing Company, Ltd.

( * ) Notice: Subject to any disclaimer, the term of this patent is extended or adjusted under 35 U.S.C. 154(b) by 109 days.

(21) Appl. No.: 12/758,491

(22) Filed: Apr. 12, 2010

(65) Prior Publication Data

US 2011/0250725 A1    Oct. 13, 2011

(51) Int. Cl.
*H01L 21/8238* (2006.01)

(52) U.S. Cl. .. 438/232; 438/229; 438/221; 257/E21.632

(58) Field of Classification Search ............ 438/232, 438/229, 221, 199, 592; 257/E21.632, E21.633, 257/E21.19, E21.334
See application file for complete search history.

(56) References Cited

U.S. PATENT DOCUMENTS

| | | | |
|---|---|---|---|
| 2007/0082415 A1* | 4/2007 | Jeon et al. | 438/3 |
| 2008/0233695 A1* | 9/2008 | Ekbote et al. | 438/221 |
| 2010/0164008 A1* | 7/2010 | Mehrad et al. | 257/369 |
| 2010/0176462 A1* | 7/2010 | Mehrad et al. | 257/412 |
| 2011/0195548 A1* | 8/2011 | Yeh et al. | 438/199 |

* cited by examiner

*Primary Examiner* — Walter L Lindsay, Jr.

(74) *Attorney, Agent, or Firm* — Lowe Hauptman Ham & Berner, LLP

(57) ABSTRACT

A method for fabricating an integrated device is disclosed. A polysilicon gate electrode layer is provided on a substrate. In an embodiment, a treatment is provided on the polysilicon gate electrode layer to introduce species in the gate electrode layer and form an electrically neutralized portion therein. Then, a hard mask layer with limited thickness is applied on the treated polysilicon gate electrode layer. A tilt angle ion implantation is thus performing on the substrate after patterning the hard mask layer and the treated polysilicon gate electrode to from a gate structure.

20 Claims, 5 Drawing Sheets

METHOD OF FABRICATING GATE ELECTRODE USING A TREATED HARD MASK

RELATED APPLICATIONS

The present disclosure is related to the following commonly-assigned U.S. patent applications, the entire disclosures of which are incorporated herein by reference: U.S. application Ser. No. 12/686,866 for "MULTI-LAYER HARD MASK".

BACKGROUND

The present disclosure relates generally an integrated circuit (IC) device and, more particularly, to method for forming a gate structure.

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed "gate last" process in which the final gate stack is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes.

There are challenges to implement such features and processes in CMOS fabrication. As technology nodes continue to decrease, particularly to 22 nm technology node and beyond, the spacing between gate stacks continue to decrease, which affects the pocket/LDD implantation process. The issue will be worse when a thick hard mask applied on a gate stack to increase the total thickness of the gate stack. A conventional hard mask layer needs to have a thick thickness to prevent boron being implanted in polysilicon gate electrode during a boron implantation process for forming LDD regions. It is difficult to remove a polysilicon gate electrode with boron species therein because of boron with positive charge. Hence, a thick hard mask is necessary in the conventional process to prevent boron being implanted in polysilicon gate electrode. However, the thick hard mask layer exacerbates the shadowing effects when forming pocket/LDD implantation process. Therefore, there is a need to provide a polysilicon gate electrode which can be removed easily without using a thick hard mask.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
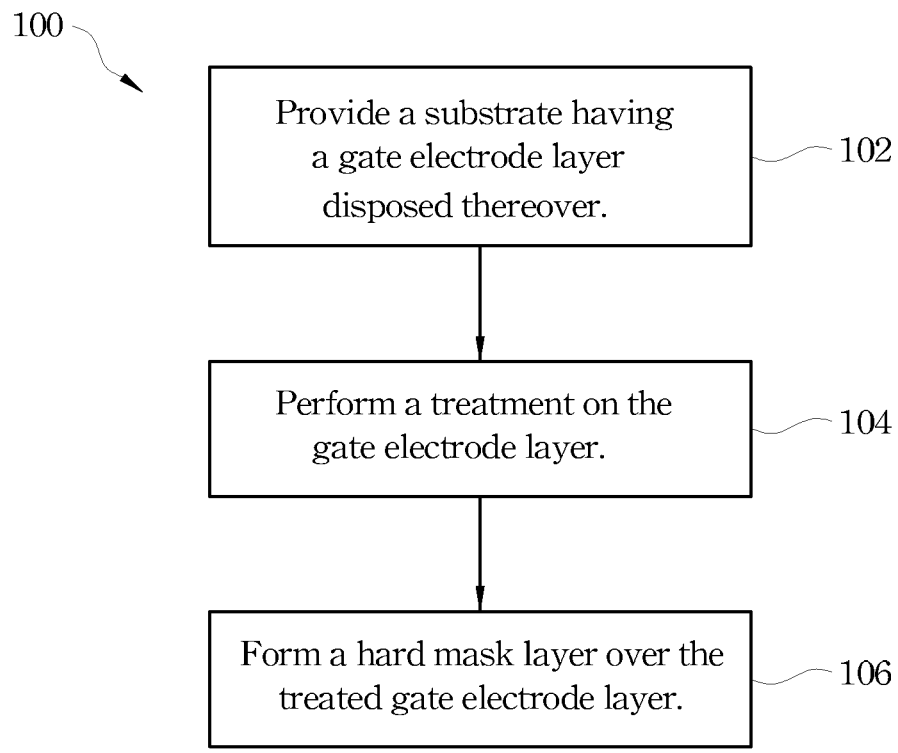
FIG. 1 is a flow chart of a method for fabricating an integrated circuit device according to aspects of the present disclosure.

The present disclosure relates generally to methods for manufacturing integrated circuit devices, and more particularly, to hard mask layers utilized for manufacturing integrated circuit devices.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-9, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOS s), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
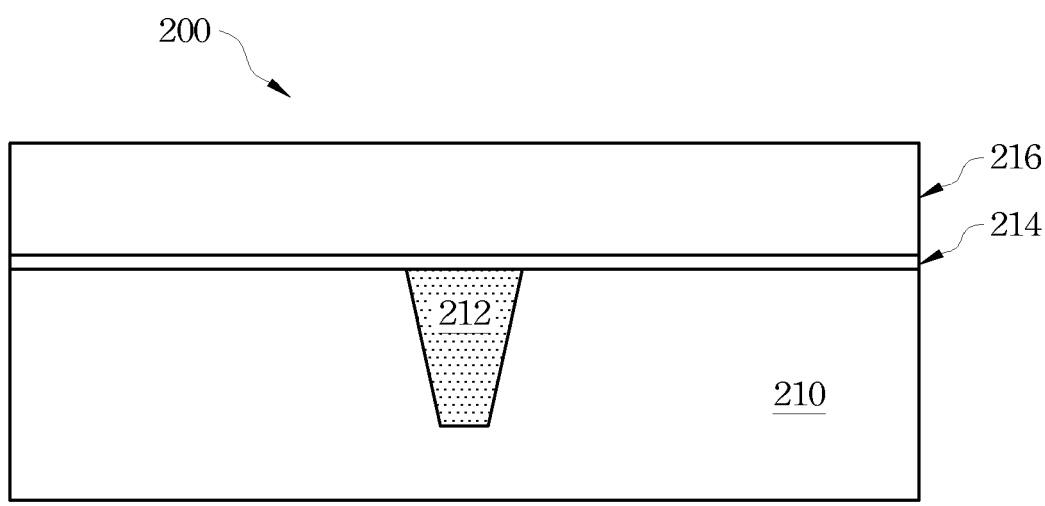
FIGS. 2-10 are various cross-sectional views of embodiments of an integrated circuit device during various fabrication stages according to the method of FIG. 1.

Referring to FIGS. 1 and 2, the method 100 begins at block 102 wherein a substrate 210 is provided. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements as known in the art (e.g., p-type wells or n-type wells). The doped regions may be doped with p-type dopants, such as boron or $BF_2$, and/or n-type dopants, such as phosphorus or arsenic. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by CMOS technology processing, and thus some processes are not described in detail herein.

An exemplary isolation region 212 is formed in the substrate 210 to isolate various regions of the substrate 210, and in the present embodiment, to isolate the NMOS and PMOS device regions. The isolation region 212 utilizes isolation technology, such as local oxidation of silicon (LOCOS) or shallow trench isolation (STI), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

A material layer is formed over the substrate 210. The material layer includes one or more material layers comprising any suitable material and thickness. The material layer can include interfacial layers, capping layers, diffusion/barrier layers, dielectric layers, high-k dielectric layers, conductive layers, gate layers, liner layers, seed layers, adhesion layers, other suitable layers, and/or combinations thereof. The material layer is formed by any suitable process including chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The semiconductor device 200 may include one or more antireflective coating layers, such as a top antireflective coating layer and/or a bottom antireflective coating layer.

In one embodiment, the material layer includes a gate dielectric layer 214 and a gate electrode layer 216. The gate dielectric layer 214 is formed over the substrate 210 by any suitable process to any suitable thickness. The gate dielectric layer 214, for example, is silicon oxide, silicon oxynitride, silicon nitride, spin-on glass (SOG), fluorinated silica glass (FSG), carbon doped silicon oxide, BLACK DIAMOND® (Applied Materials of Santa Clara, Calif.), XEROGEL, AEROGEL, amorphous fluorinated carbon, Parlyene, BCB (bis-benzocyclobutenes), SILK® (Dow Chemical, Midland, Mich.), polyimide, other suitable dielectric materials, or combinations thereof. The gate dielectric layer 214 may comprise a high-k dielectric material, such as $HfO_2$, HfSiO, HfSiON, HfTaO, HfTiO, HfZrO, other suitable high-k dielectric materials, and/or combinations thereof. The gate dielectric layer 214 can further include an interfacial layer, which comprises a grown silicon oxide layer (e.g., thermal oxide or chemical oxide) or silicon oxynitride (SiON).

The gate electrode layer 216 is formed over the gate dielectric layer 214 by any suitable process to any suitable thickness. In the present embodiment, the gate electrode layer 216 is a polysilicon layer. The polysilicon (or poly) layer is formed by CVD or other suitable deposition process. For example, silane ($SiH_4$) may be used as a chemical gas in the CVD process to form the gate electrode layer 216. The gate electrode layer 216 may include a thickness ranging from about 400 to about 800 angstrom (Å). In another embodiment, gate electrode layer 216 and/or the gate dielectric layer 214 may be sacrificial layers and will be removed by a replacement step after a gate patterning process.

Figure 3:
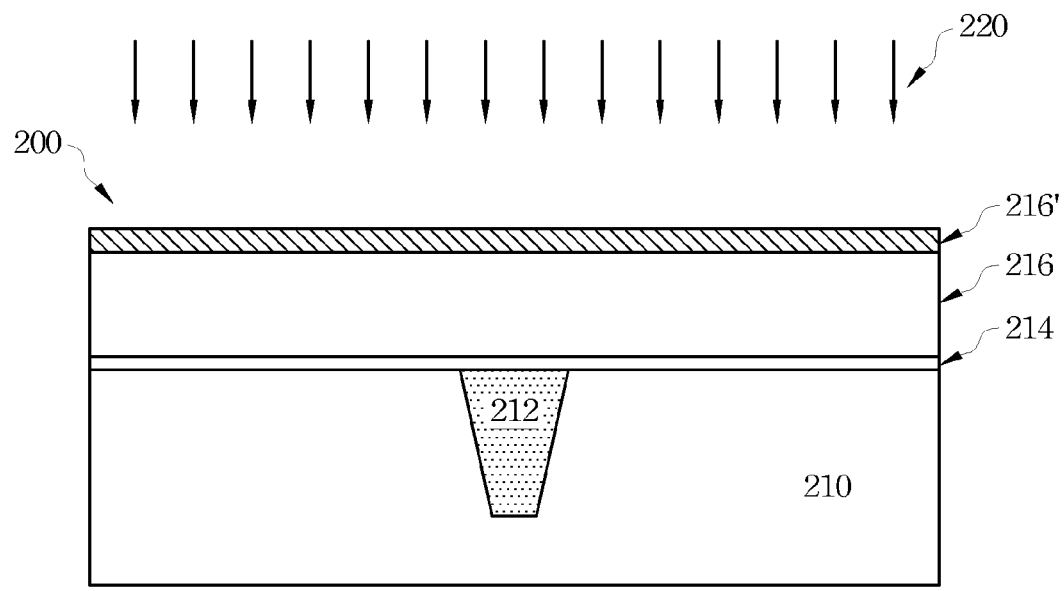

Referring to FIGS. 1 and 3, the method 100 proceeds to block 104 wherein a treatment 220 is performed on the gate electrode layer 216 to transform at least one portion of the gate electrode layer 216 to an electrically neutralized layer 216'. The electrically neutralized layer 216' is used to neutralize positive charge within polysilicon gate electrode induced by boron implant through the hard mask. In one embodiment, the electrically neutralized layer 216' is positioned within the gate electrode layer 216. In another embodiment, the electrically neutralized layer 216' is positioned at top portion of the gate electrode layer 216. In some embodiments, the treatment 220 may introduce additional species in the polysilicon gate electrode layer 216 by an energy source. The energy source of the treatment may be provided by an ion implantation process, or other suitable processes including thermal diffusion, plasma, e-beam, ultraviolet (UV), or combinations thereof. In some embodiments, the treatment may introduce species with valence of 5, e.g., arsenic (As), phosphorous (P), nitrogen (N), so as to trap and neutralize boron implant species introduced by a subsequent implantation process for forming LDD regions, and to prevent boron from penetrating into the polysilicon gate electrode layer 216. Hence, the electrically neutralized layer 216' is a part of the gate electrode layer with additional species with valence of 5. The ion implantation is preferably performed at a relatively low energy to prevent damage of gate channel and enhance neutralization efficiency. For example, the ion implantation process is performed at energy not greater than about 5 KeV. The ion implantation is preferably performed at a relatively high dose because the species with higher dose may obtain higher neutralization efficiency. In one embodiment, the ion implantation process is performed with a dose not less than about $1E14$ atoms/$cm^2$.

Figure 4:
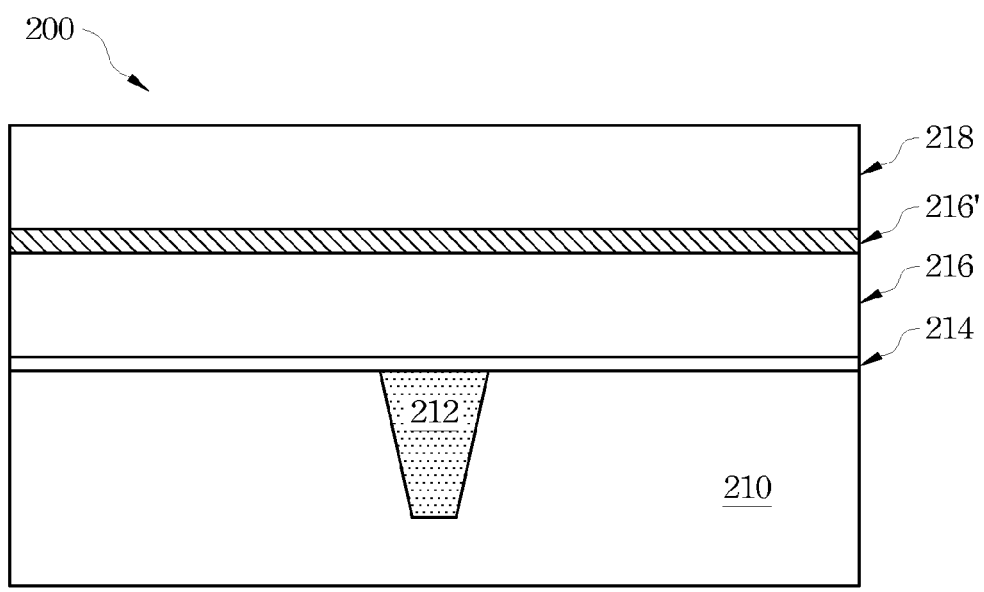

Referring to FIGS. 1 and 4, the method 100 continues with block 106 in which a hard mask layer 218 is formed over the electrically neutralized layer 216' by any suitable process to any suitable thickness. The hard mask layer 218, in one embodiment, includes silicon oxide. The hard mask layer 218, in another embodiment, may include silicon nitride (SiN), silicon oxynitride (SiON), silicon carbide (SiC), SiOC, spin-on glass (SOG), a low-k film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof. The silicon oxide layer may be formed using methods such as CVD, PVD, or ALD and may have a thickness ranging from about 300 to about 800 angstrom (Å).

Figure 5:
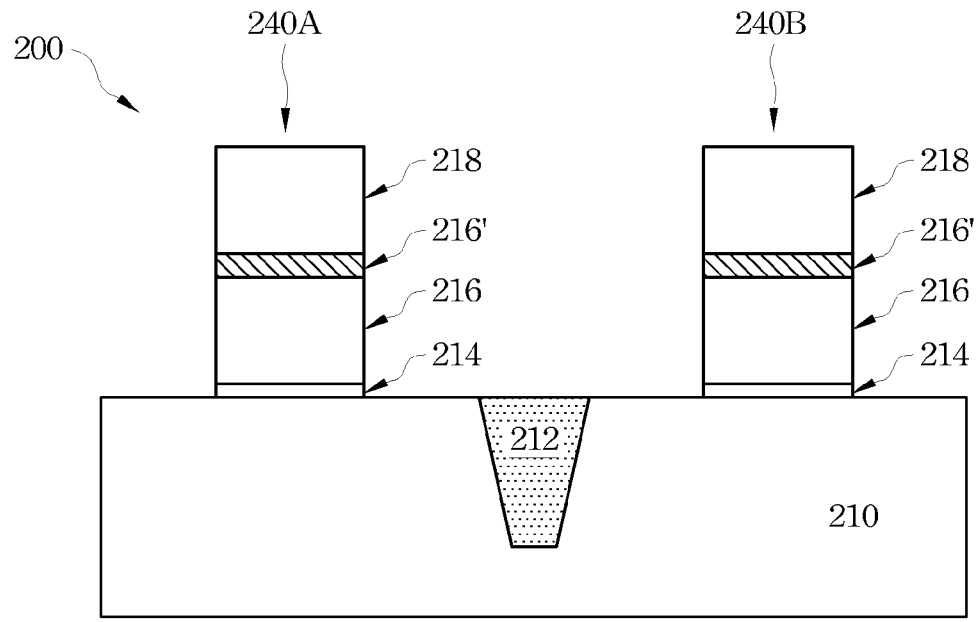

Referring to FIG. 5, gate structures comprising a gate dielectric 214, a gate electrode 216, an electrically neutralized portion 216', and a hard mask 218 are formed by any suitable process. For example, a layer of photoresist (not shown) is formed over the treated hard mask layer 218' by a suitable process, such as spin-on coating, and patterned to form a patterned photoresist feature. The pattern of the photoresist can then be transferred by a dry etching process to the underlying gate dielectric layer 214, the gate electrode layer 216, the electrically neutralized portion 216', and the hard mask layer 218 to form the gate structures. Additionally, an anti-reflective coating (ARC) layer (not shown) may be formed on the hard mask layer 218 and under the layer of photoresist to enhance a subsequent patterning process as known in the art. The photolithography patterning processes may include soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. Then, an etching process, including dry etching, wet etching, and/or other etching methods (e.g., reactive ion etching) is provided to from a gate structure for the PMOS device 240A and a gate structure for the NMOS device 240B. The photoresist layer may be stripped thereafter. It is understood that the above examples do not limit the processing steps that may be utilized to form the gate structures.

Figure 6:
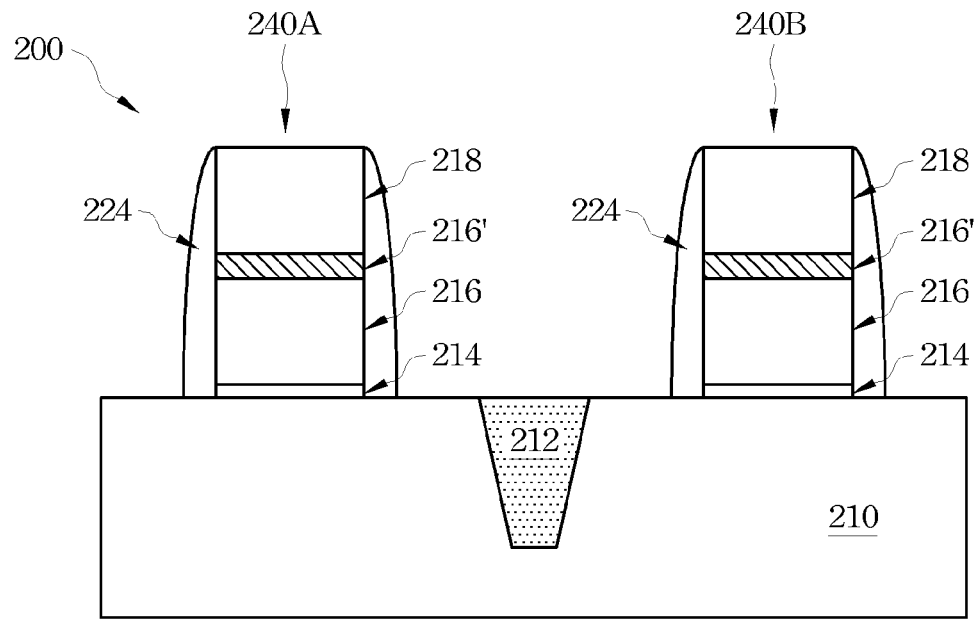

Referring to FIG. 6, offset spacers 224 are formed overlying sidewalls of the PMOS/NMOS devices 240A/240B. In an example, the offset spacers 224 are formed by blanket depositing a dielectric layer over the gate structures of PMOS/NMOS devices 240A/240B and the substrate 210, and then patterning the dielectric layer to form offset spacers 224. The dielectric layer comprise, for example, silicon nitride, silicon oxide, silicon carbide, silicon oxynitride, other suitable materials, and/or combinations thereof. The thickness of the dielectric layer is ranging from 100 Å to about 300 Å. The dielectric layer may be formed by using commonly used techniques, such as plasma enhanced chemical vapor deposition (PECVD), low-pressure chemical vapor deposition (LPCVD), sub-atmospheric chemical vapor deposition (SACVD), atomic layer deposition (ALD), and the like. The patterning may be performed by either a wet etching process, a dry etching process, or combinations thereof. Preferably, the dielectric layer is patterned by a dry etching process. More preferably, the dielectric layer is patterned by an anisotropic dry etching process.

Figure 7:
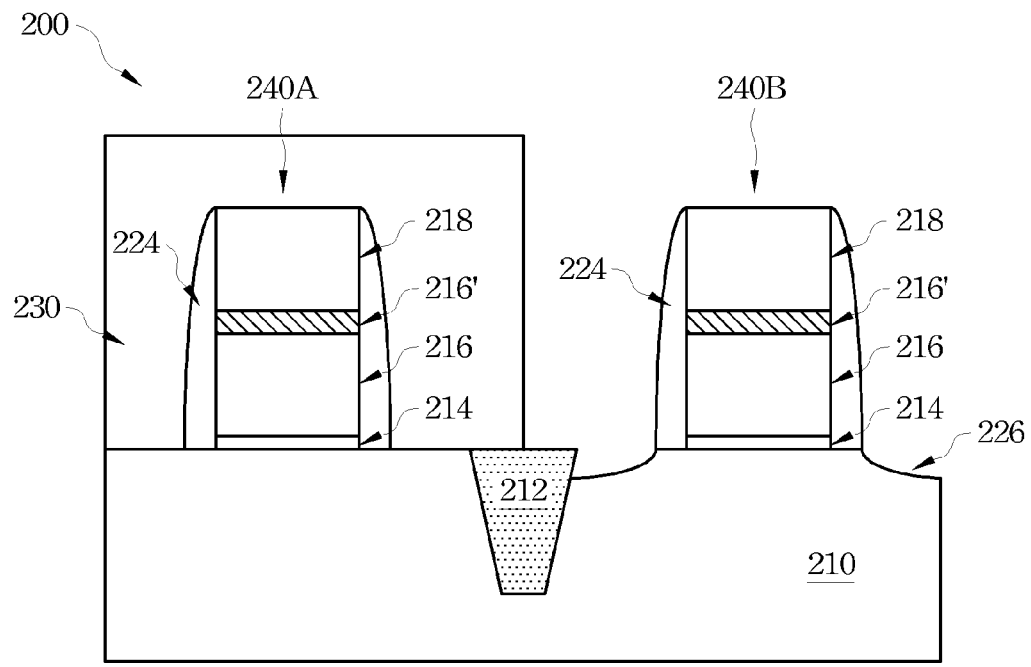
Figure 8:
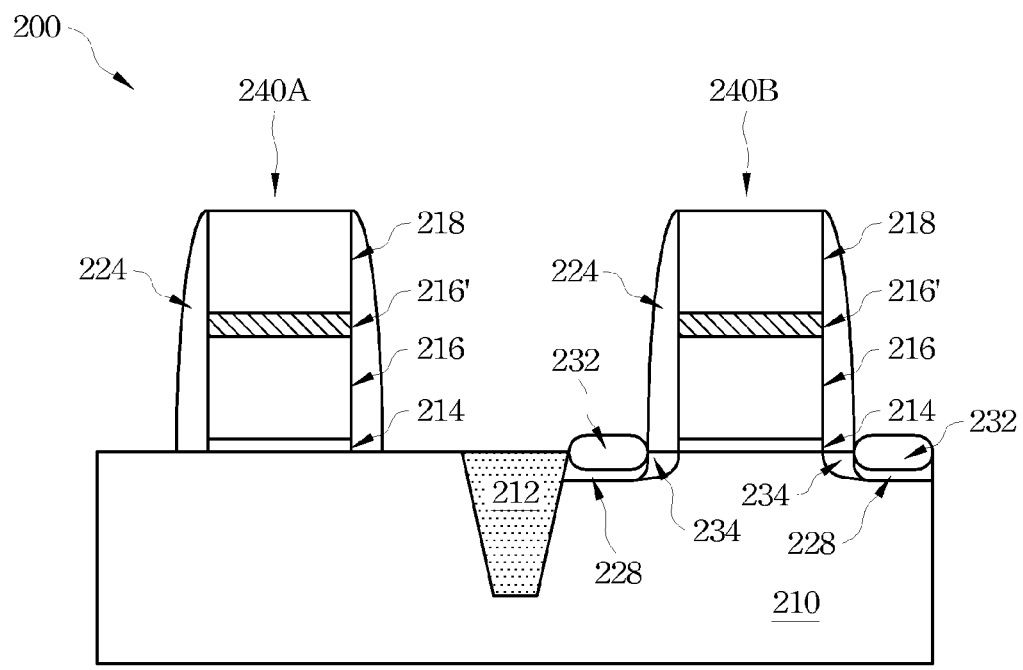

Referring to FIG. 7, recesses 226 may be optionally formed on each side of the gate structure of NMOS device 240B in the substrate 210. There are not recesses formed around the PMOS device 240A at this time by covering a protector 230, e.g., a photoresist pattern, thereon while the NMOS device 240B is exposed. The recesses 226 may be formed by any suitable process and are substantially aligned with edges of the offset spacers 224 of the gate structure of NMOS device 240B. The recesses 226 may be formed by a selective etching process, which can include one or more wet etching and/or dry etching processes. Then, the protector 230 may be removed by a stripping process as known in the art. Thereafter, N-type strained source/drain (NSSD) regions 228 are formed by any suitable process over the recesses 226 as illustrated in FIG. 8. In one embodiment, the NSSD regions 228 are formed by one or more epitaxial growth processes to any suitable thickness. An exemplary NSSD regions 228 thickness is approximately 200 Å. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210. The NSSD regions 228 comprise any suitable material, such as epitaxially grown silicon, SiC, and/or combinations thereof. A cleaning process may be subsequently performed, such as cleaning process utilizing a DHF cleaning solution.

Referring to FIG. 8, various implantation processes are performed on the substrate 210. The various implantation processes may form various doped regions. The doped regions may comprise various doping profiles and may be formed by a plurality of implantation processes. In one embodiment, N-type lightly doped source/drain (NLDD) regions 232 may be formed in or under the NSSD regions 228 by one or more ion implantation processes. The NLDD regions 232 are substantially aligned with edges of the offset spacers 224 of the gate structure of NMOS device 240B. In another embodiment, P-type pocket regions 234 may be formed adjacent to the NSSD regions 228 and under the offset spacers 224 by one or more ion implantation processes. The implantation for forming the NLDD/P-type pocket regions 232, 234 may employ tilt angle processes by any suitable angles. In one embodiment, approximately 25° to about 30° of the tilt angle is utilized. In the conventional process, there is a need of thick hard mask to prevent from boron implanted in polysilicon gate electrode. However, the tilt-angle implantation may be subject to shadowing side effects if using the thick hard mask. As noted above, the thickness of hard mask layer 218 may thin down to about 300 Å by introducing the electrically neutralized layer 216'. Therefore, the shadowing effects during tilt angle implantation processes is prevented during formation of the NLDD/P-type pocket regions.

Figure 9:
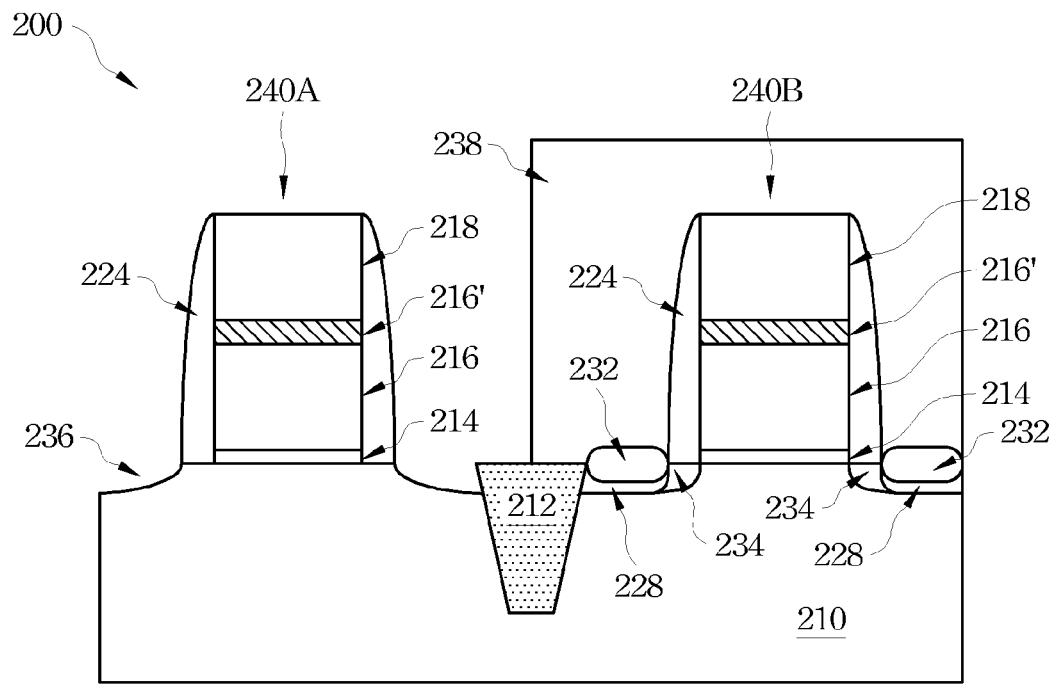

Referring to FIG. 9, recesses 236 are formed on each side of the gate structure of PMOS device 240A in the substrate 210. A protector 238, e.g., photoresist pattern, may be formed overlying the NMOS device 240B while the PMOS device 240A is exposed. The recesses 236 are formed on each side of the gate structure of PMOS device 240A by any suitable process, and are substantially aligned with edges of the offset spacers 224 of the gate structure of PMOS device 240A. The recesses 236 may be formed by a selective etching process, which can include one or more wet etching and/or dry etching processes. Then, the protector 238 is removed by a stripping process as know in the art.

Figure 10:
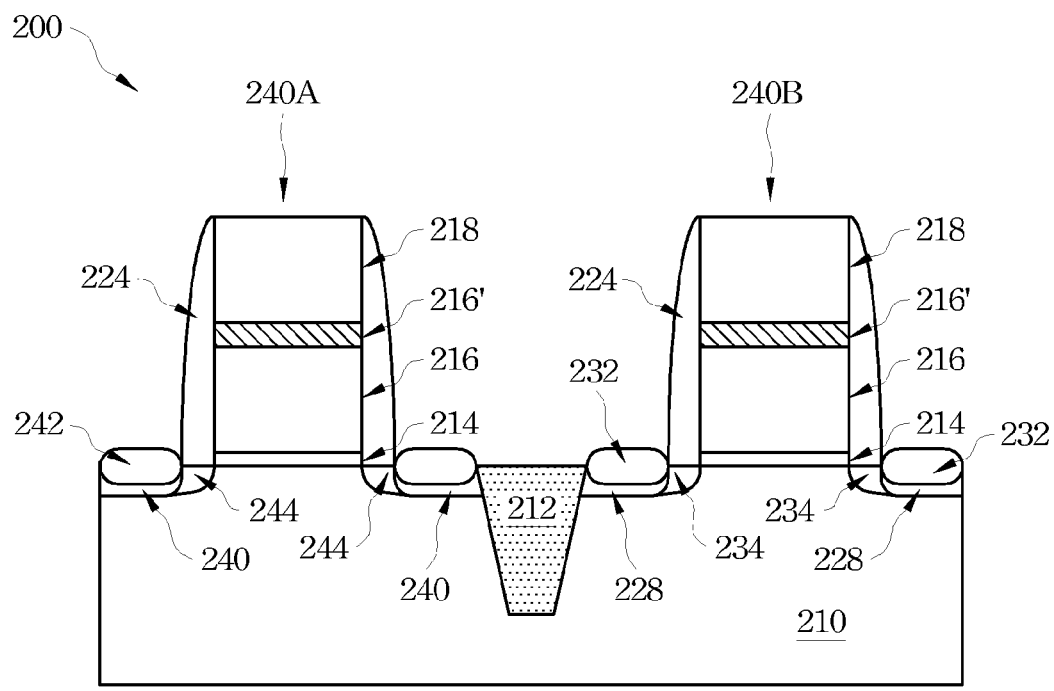

Referring to FIG. 10, P-type strained source/drain drain (PSSD) regions 240 are formed by any suitable process over the recesses 236. In one embodiment, the PSSD regions 240 are formed by one or more epitaxial growth processes to any suitable thickness. The exemplary PSSD regions 240 thickness is approximately 200 Å. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210. The PSSD regions 240 comprise any suitable material, such as epitaxially grown SiGe. A cleaning process may be subsequently performed, such as cleaning process utilizing a DHF cleaning solution.

Subsequently, various implantation processes are performed on the substrate 210. The various implantation processes may form various doped regions. The doped regions may comprise various doping profiles and may be formed by a plurality of implantation processes. In one embodiment, P-type lightly doped source/drain (PLDD) regions 242 may be formed in PSSD regions 240 by one or more ion implant processes. The PLDD regions 242 are substantially aligned with the edges of the offset spacers 224 of the gate structure of PMOS device 240A. In another embodiment, N-type pocket regions 244 may be formed adjacent to the PSSD regions 240 and under the offset spacers 224 by one or more ion implant processes. The implantation for forming the PLDD/N-type pocket regions 242,244 may employ tilt angle processes by any suitable angles. In one embodiment, the angles for forming the PLDD/N-type pocket regions 242,244 are similar to the angles for forming the NLDD/P-type pocket regions 232, 234. In one embodiment, approximately about 25° to about 30° of the tilt angle is utilized. The tilt angle implantation may be subject to shadowing side effects if the thickness of the gate structures 240A is too high. In the conventional process, there is a need of thick hard mask to prevent from boron implanted in polysilicon gate electrode. However, the tilt-angle implantation may be subject to shadowing side effects if using the thick hard mask. As noted above, the thickness of hard mask layer 218 may thin down to about 300 Å by introducing the electrically neutralized layer 216'. Therefore, the shadowing effects during tilt angle implantation processes is prevented during formation of the NLDD/P-type pocket regions.

Source/drain (S/D) regions (not shown) may be formed in the substrate 210 for the NMOS/PMOS devices 240B, 240A by a conventional implantation process. One or more contact features (not shown), such as silicide regions, may also be formed by any suitable process on the S/D regions.

Subsequent processing may implement a gate replacement process. For example, metal gates may replace the gate electrode 216 and the electrically neutralized portion 216' of the gate structures of the NMOS/PMOS devices 240B, 240A. A first metal gate having a first work function may be formed in the gate structure of the NMOS devices 240B and a second gate structure having a second work function may be formed in the gate structure of the PMOS devices 240A. The metal gates may comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, the method comprising:
   forming a gate electrode layer over a substrate;
   performing a treatment on the gate electrode layer to introduce species therein, wherein the treatment forms an electrically neutralized portion at a top portion of the gate electrode layer;
   forming a hard mask layer over the treated gate electrode layer; and
   patterning the hard mask layer and the treated gate electrode layer.

2. The method of claim 1, wherein the hard mask layer is a silicon oxide layer.

3. The method of claim 1, wherein the hard mask layer have a thickness less than or equal to approximately 800 Angstroms.

4. The method of claim 1, wherein the gate electrode layer is a polysilicon layer.

5. The method of claim 1, wherein valence of the species is 5.

6. The method of claim 1, wherein the species is at least one of arsenic, phosphorous, nitrogen or the combinations thereof.

7. The method of claim 1, wherein the treatment is at least one of thermal diffusion, ion implantation, plasma, UV, e-beam or the combinations thereof.

8. The method of claim 1, wherein the treatment is ion implantation and the ion implantation is performed at an energy less than or equal to approximately 5 KeV.

9. The method of claim 8, wherein the ion implantation is performed with a dose greater than about 1E14 atoms/cm$^2$.

10. The method of claim 1, further comprising:
    forming lightly-doped source/drain (LDD) regions in the substrate by an implantation process utilizing a tilt-angle of approximately 25° to about 30°.

11. A method of manufacturing a gate structure, the method comprising:
    forming a gate electrode layer over a substrate, said substrate having an isolation region and first and second regions on opposite sides of the isolation region;
    performing a treatment on the gate electrode layer to form an electrically neutralized portion within the gate electrode layer, wherein the treatment is simultaneously performed over both said first and second regions of the substrate;
    forming a hard mask layer over the treated gate electrode layer; and
    patterning the hard mask layer and the treated gate electrode layer.

12. The method of claim 11, wherein the treatment comprises an ion implantation process.

13. The method of claim 12, wherein the ion implantation implants at least one of arsenic, phosphorous, nitrogen or the combinations thereof in the gate electrode layer.

14. The method of claim 13, wherein the implantation is performed at an energy less than or equal to approximately 5 KeV.

15. The method of claim 13, wherein the ion implantation is performed with a dose greater than about 1E14 atoms/cm$^2$.

16. A method for manufacturing a gate electrode, the method comprising:
    providing a substrate;
    forming a polysilicon gate electrode layer over the substrate;
    providing a treatment on the polysilicon gate electrode layer to introduce species with valence of 5 within the polysilicon gate electrode layer;
    forming a hard mask layer over the treated gate electrode layer;

patterning the hard mask layer and the treated gate electrode layer to form a gate structure of a P-type metal-oxide-semiconductor (PMOS) device and a gate structure of an N-type metal-oxide-semiconductor (NMOS) device;

forming n-type strained source/drain (NSSD) regions in the substrate, wherein the NSSD regions are adjacent to the edges of the gate structure of the NMOS device;

forming p-type strained source/drain (PSSD) regions in the substrate, wherein the PSSD regions are adjacent to the edges of the gate structure of the PMOS device;

forming n-type lightly-doped source/drain (NLDD) regions in or under the NSSD regions by a first tilt-angle ion implantation; and forming p-type lightly-doped source/drain (PLDD) regions in the PSSD regions by a second tilt-angle ion implantation.

17. The method of claim 16, wherein the species is at least one of arsenic, phosphorous, nitrogen or the combinations thereof.

18. The method of claim 16, wherein the treatment comprises an ion implantation process.

19. The method of claim 11, wherein the first and second regions are N-type metal-oxide-semiconductor (NMOS) and P-type metal-oxide-semiconductor (PMOS) device regions, respectively.

20. The method of claim 19, wherein the electrically neutralized portion is formed simultaneously over both the NMOS and PMOS device regions.

* * * * *